(12) United States Patent
Jang et al.

(10) Patent No.: US 7,737,512 B2
(45) Date of Patent: Jun. 15, 2010

(54) INTEGRATED CIRCUIT DEVICES HAVING UNIFORM SILICIDE JUNCTIONS

(75) Inventors: Se-myeong Jang, Kyungki-do (KR);
Gyo-young Jin, Kyungki-do (KR);
Yong-chul Oh, Kyungki-do (KR);
Hyun-chang Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 34 days.

(21) Appl. No.: 11/853,361

(22) Filed: Sep. 11, 2007

(65) Prior Publication Data
US 2008/0001235 A1 Jan. 3, 2008

Related U.S. Application Data

(60) Continuation of application No. 11/166,979, filed on Jun. 24, 2005, now Pat. No. 7,329,927, which is a division of application No. 10/422,430, filed on Apr. 24, 2003, now Pat. No. 6,974,752.

(30) Foreign Application Priority Data
May 15, 2002 (KR) .............................. 02-026785

(51) Int. Cl.
*H01L 31/119* (2006.01)
(52) U.S. Cl. .............. 257/413; 257/377; 257/384; 257/576; 257/E29.255; 257/E21.165

(58) Field of Classification Search .............. 257/377, 257/413, 382–384, 455–456, 576
See application file for complete search history.

(56) References Cited

U.S. PATENT DOCUMENTS

| | | | | |
|---|---|---|---|---|
| 5,783,475 A | * | 7/1998 | Ramaswami | 438/303 |
| 5,814,537 A | * | 9/1998 | Maa et al. | 438/151 |
| 6,693,013 B2 | * | 2/2004 | Bae et al. | 438/303 |

FOREIGN PATENT DOCUMENTS

JP 09-325037 11/1997

OTHER PUBLICATIONS

Office Action issued by the Chinese Patent Office corresponding to Chinese Patent Application No. 03136040.8, mailed Jun. 30, 2006.

* cited by examiner

*Primary Examiner*—Dung A Le
(74) *Attorney, Agent, or Firm*—Myers Bigel Sibley & Sajovec

(57) ABSTRACT

Integrated circuit devices are provided including an integrated circuit substrate and a gate on the integrated circuit substrate. The gate has sidewalls. A barrier layer spacer is provided on the sidewalls of the gate. A portion of the barrier layer spacer protrudes from the sidewalls of the gate exposing a lower surface of the barrier layer spacer that faces the integrated circuit substrate. A silicide layer is provided on the portion of the barrier layer spacer protruding from the sidewalls of the gate.

38 Claims, 13 Drawing Sheets

INTEGRATED CIRCUIT DEVICES HAVING UNIFORM SILICIDE JUNCTIONS

RELATED APPLICATIONS

This application is a continuation application of U.S. Ser. No. 11/166,979; filed Jun. 24, 2005 now U.S. Pat. No. 7,329,927, which is a divisional application of Ser. No. 10/422,430, filed Apr. 24, 2003 now U.S. Pat. No. 6,974,752, which claims priority from Korean Patent Application No. 2002-0026785, filed May 15, 2002, the contents of which are hereby incorporated herein by reference as if set forth in their entirety.

FIELD OF THE INVENTION

The present invention relates to methods of fabricating integrated circuit devices and associated integrated circuit devices and, more particularly, to silicide methods of fabricating integrated circuit devices and associated integrated circuit devices.

BACKGROUND OF THE INVENTION

As integrated circuit devices become more highly integrated, source and drain regions may more often be formed in shallow junction regions to stabilize the characteristics of transistor. Furthermore, a contact with low resistance may be formed on the source and drain regions to facilitate high-speed operation of the transistor.

Conventional processes for forming source/drain regions in shallow junctions may include forming a source/drain region that does not extend deep into the substrate and raising the height of the source/drain region by forming a silicon epitaxial layer on the shallow source/drain region using a selective epitaxial layer growth (SEG) method. Furthermore, conventional processes for forming a source/drain region with low resistance may include depositing a metal such as Titanium (Ti), Cobalt (Co) and/or Nickel (Ni) on the source/drain regions, performing a solid-state reaction and forming a low-resistant silicide layer.

Conventional methods of fabricating integrated circuit devices using an SEG method and a silicide layer as described above will be described further below with respect to FIGS. 1 through 3. FIGS. 1 through 3 are cross sectional views illustrating processing steps in the fabrication of conventional integrated circuit devices. As illustrated in FIG. 1, a gate stack pattern 20 is formed on an integrated circuit substrate 10. The gate stack pattern 20 includes a gate insulating layer 12, gate electrodes 14 and 16, and a capping layer 18. The gate insulating layer 12 includes, for example, an oxide, and the gate electrodes 14 and 16 include, for example, polysilicon and tungsten silicide. The capping layer 18 includes, for example, nitride.

A low-concentration impurity region 22 is formed on the integrated circuit substrate 10 to be aligned with the gate stack pattern 20. Gate spacers 24 are formed on both sidewalls of the gate stack pattern 20. The gate spacers 24 are formed by anisotropically etching a nitride layer that is formed on the surface of the integrated circuit substrate 10.

A high-concentration impurity region 26 is formed on the integrated circuit substrate 10 to be aligned with the gate spacers 24. Consequently, the source/drain region includes both the low-concentration impurity region 22 and the high-concentration impurity region 26. A silicon epitaxial layer 28 is formed on the high-concentration impurity region 26 of the source/drain region using the SEG method. Generally, use of the SEG method generates a facet 30 in which the silicon epitaxial layer 28 grows thinner than other parts in the junction.

As illustrated in FIG. 2, a metal layer 32 is formed on the surface of the integrated circuit substrate 10 having the gate spacers 24 and the silicon epitaxial layer 28. In other words, the metal layer 32 is formed on the gate spacers 24, the silicon epitaxial layer 28, and the capping layer 18. The metal layer 32 is formed of a metal, such as Ti, Co, Ni, or the like.

As illustrated in FIG. 3, a silicidation process is performed in which the silicon epitaxial layer 28 and the metal layer 32 are thermally treated. Through this process, the silicon epitaxial layer 28 formed on the high-concentration impurity region 26 becomes a silicide layer 34, but the metal layer 32 formed on the capping layer 18 and the gate spacers 24 does not turn into a silicide layer. The metal layer 32 is removed by performing a wet etch.

According to the methods of fabricating conventional integrated circuit devices described with respect to FIGS. 1 through 3, the silicon epitaxial layer 28 grown by the SEG method on the high-concentration impurity region 26 does not typically have a uniform thickness over the high-concentration impurity region 26 due to the facet 30 in the regions adjacent to the gate spacers 24. Accordingly, the silicide layer may be formed close to the edge of the high-concentration impurity region and extend too far into the high-concentration impurity region/substrate under a thinner portion of silicon epitaxial layer 28 near the edge area of the source/drain region. This may cause the device to exhibit weak junction leakage current characteristics because, for example, the silicide layer penetrates too far into the substrate 10 and the silicide junction (36 of FIG. 3) may not be uniform.

SUMMARY OF THE INVENTION

Embodiments of the present invention provide integrated circuit devices including an integrated circuit substrate and a gate on the integrated circuit substrate. The gate has sidewalls. A barrier layer spacer is provided on the sidewalls of the gate. A portion of the barrier layer spacer protrudes from the sidewalls of the gate exposing a lower surface of the barrier layer spacer that faces the integrated circuit substrate. A silicide layer is provided on the portion of the barrier layer spacer protruding from the sidewalls of the gate.

In some embodiments of the present invention, the integrated circuit device may include source and drain regions on the integrated circuit substrate. The silicide layer may be located on the source and drain regions such that the silicide layer extends into the source and drain regions. The silicide layer may have a planar junction with the source and drain regions. The source and drain regions may include a lightly doped conductivity type portion and a highly doped conductivity type portion.

In further embodiments of the present invention, an insulating layer may be provided on the source and drain regions of the integrated circuit substrate. The insulating layer may expose a portion of the source and drain regions. The silicide layer may be provided on the exposed portion of the source and drain regions. The portion of the barrier layer spacer that protrudes from the sidewalls of the gate may extend beyond an end of the insulating layer.

In still further embodiments of the present invention, the gate may include a gate stack pattern including a gate insulating layer on the integrated circuit substrate, a first gate electrode on the insulating layer, a second gate electrode on the first gate electrode, and a capping layer on the second gate electrode. In certain embodiments of the present invention, the integrated circuit device may be a dynamic random access memory (DRAM) device.

Some embodiments of the present invention provide integrated circuit devices including a gate on an integrated circuit substrate. The gate has sidewalls. Source and drain regions are provided on the integrated circuit substrate and an insulating layer is provided on a portion of the integrated circuit substrate. A barrier layer spacer is provided on the sidewalls of the gate and the insulating layer and extends beyond an end of the insulating layer exposing a lower surface of the barrier layer spacer and a portion of the source and drain regions. A silicide layer is provided on the exposed portions of the source and drain regions.

Further embodiments of the present invention provide integrated circuit devices including an integrated circuit substrate and a gate on the integrated circuit substrate. The gate has sidewalls. A barrier layer spacer is provided on the sidewalls of the gate. The barrier layer spacer has a cantilevered portion that extends away from the sidewalls of the gate and exposes a lower surface of the barrier layer spacer that faces the integrated circuit substrate.

Still further embodiments of the present invention provide integrated circuit devices including a gate on an integrated circuit substrate. A source and/or drain region is provided on both sides of the gate, the source and/or drain region having a lightly doped portion and a highly doped portion. A silicide barrier layer is provided having an end that extends away from the gate beyond a boundary between the lightly doped portion and the highly doped portion of the source and/or drain region that inhibits silicidation thereunder.

DETAILED DESCRIPTION OF EMBODIMENTS OF THE PRESENT INVENTION

Figure 1:
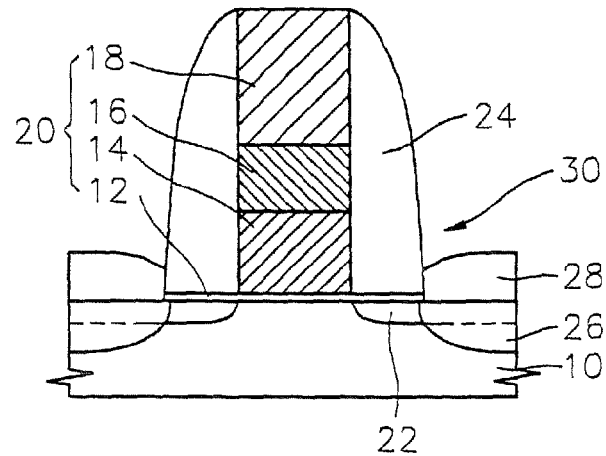
FIGS. 1 through 3 are cross sectional views illustrating processing steps in the fabrication of conventional integrated circuit devices.
Figure 2:
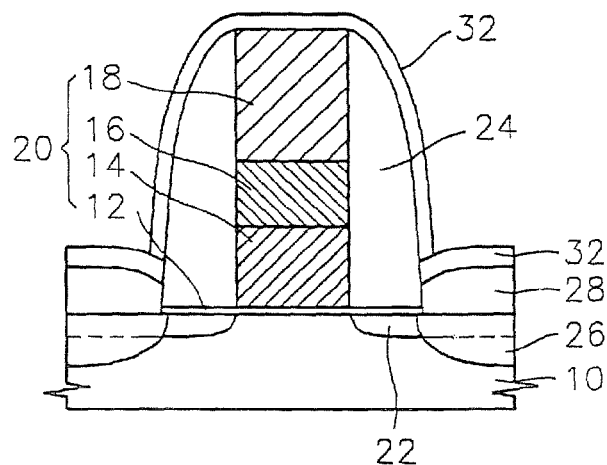
Figure 3:
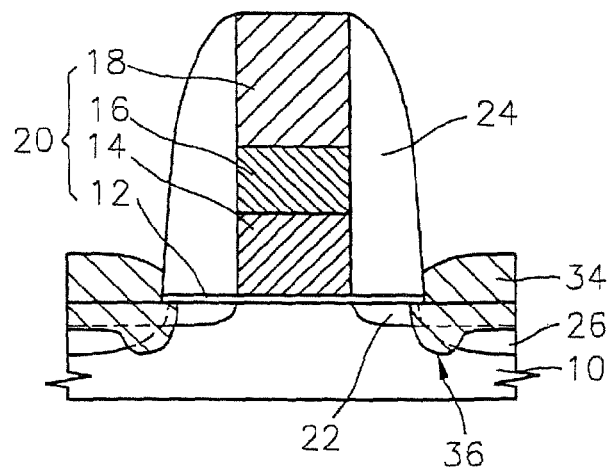

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, when a layer is referred to as being "on" another layer, it can be directly on the other layer or intervening layers may be present. In contrast, when a layer is referred to as being "directly on" another layer, there are no intervening layers present. Like reference numerals refer to like elements throughout.

Embodiments of the present invention will be described below with respect to FIGS. 4 through 20. Embodiments of the present invention provide integrated circuit devices having a barrier layer spacer including a cantilevered portion that extends beyond an end of an insulating layer exposing a lower surface of the barrier layer spacer and a portion of the source and drain regions. The formation of this cantilevered portion may inhibit the formation of silicide near an edge of the source/drain region as discussed herein. Accordingly, integrated circuits according to embodiments of the present invention may provide integrated circuit devices having improved junction leakage current characteristics.

Figure 4:
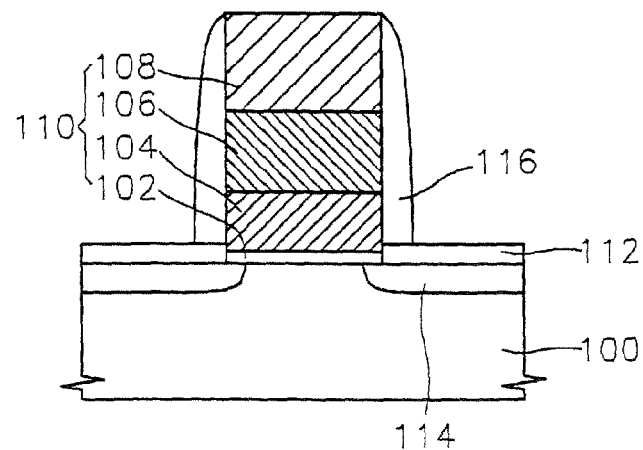
FIGS. 4 through 11 are cross sectional views illustrating processing steps in the fabrication of integrated circuit devices according to embodiments of the present invention.

FIGS. 4 through 11 are cross sectional views of integrated circuit devices according to embodiments of the present invention during intermediate fabrication steps according to embodiments of the present invention. Referring to FIG. 4, a gate stack pattern 110 is formed on an integrated circuit substrate 100. The gate stack pattern 110 may include a gate insulating layer 102, gate electrodes 104 and 106, and a capping layer 108. The gate-insulating layer 102 may include, for example, an oxide, and the gate electrodes 104 and 106 may include, for example, polysilicon and tungsten silicide, respectively. The capping layer 108 may include, for example, nitride. Although embodiments of the present invention are described herein with respect to a gate having a gate stack pattern, embodiments of the present invention are not limited to this configuration. It will be understood that other conventional gates may also be formed without departing from the teachings of the present invention.

An insulating layer 112 may be formed on the surface of the integrated circuit substrate 100. The insulating layer 112 may be, for example, an oxide layer. In these embodiments, the integrated circuit substrate 100 having the gate stack pattern 110 is oxidized to form an oxide layer. The oxide layer may inhibit the likelihood of damage caused by etching during the formation of the gate stack pattern 110. During the oxidation of the integrated circuit substrate 100, a thin oxide layer (not shown) may also be formed on the sidewalls of the gate electrodes 104 and 106.

A low-concentration impurity region 114 is formed on the integrated circuit substrate 100 to be aligned with the gate stack pattern 110. The low-concentration impurity region 114 may be a source/drain region. In an NMOS transistor, the low-concentration impurity region may be an n-type impurity region and in a PMOS transistor it may be a p-type impurity region. Gate spacers 116 are formed on the sidewalls of the gate stack pattern 110. The gate spacers 116 may be formed by, for example, performing an anisotropic etch after the insulating layer 112 is formed on the surface of the integrated circuit substrate 100. It will be understood that other conventional gate spacers may also be formed without departing from the teachings of the present invention.

Figure 5:
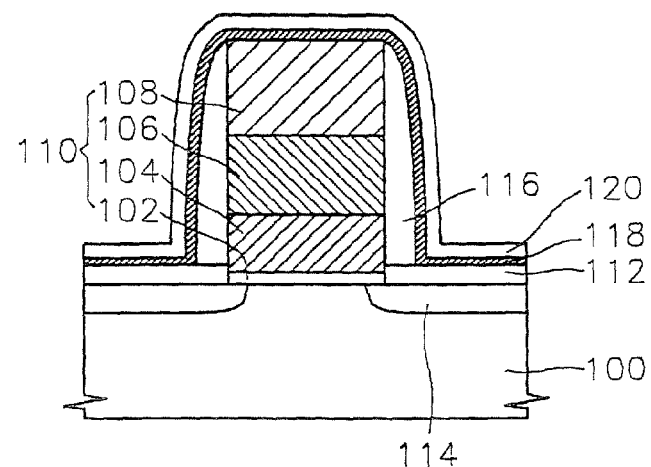

Referring now to FIG. 5, a barrier layer 118 and a sacrificial layer 120 are formed on the surface of the integrated circuit substrate 100 including the gate stack pattern 110 and the gate spacers 116. In other words, the barrier layer 118 and the sacrificial layer 120 are sequentially formed on the surface of the integrated circuit substrate 100. The barrier layer 118 may be, for example, a nitride layer, and the sacrificial layer 120 may be, for example, an oxide layer. The sacrificial layer 120 is etched to form a gate sacrificial spacer in a later process. The thickness of the sacrificial layer 120 may determine the size of the high-concentration impurity region in a subsequent ion-implant process.

Figure 6:
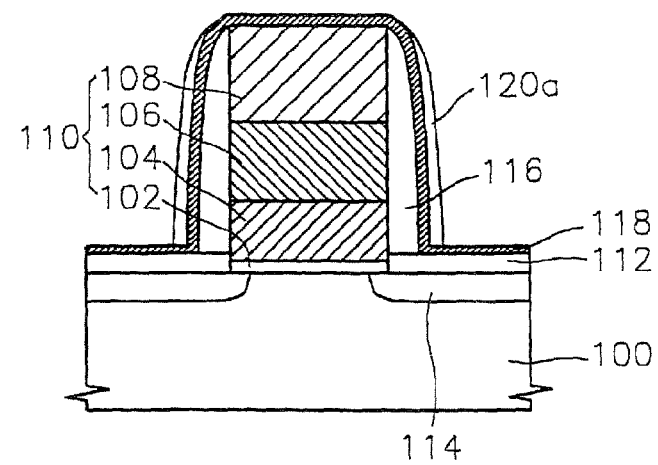

Referring now to FIG. 6, a gate sacrificial spacer 120a is formed on the barrier layer 118 on the upper part of the gate spacers 116 by, for example, anisotropically etching the sacrificial layer 120. In other words, the sacrificial layer 120 is anisotropically etched and becomes the gate sacrificial spacer 120a on the upper part of the gate spacers 116.

Figure 7:
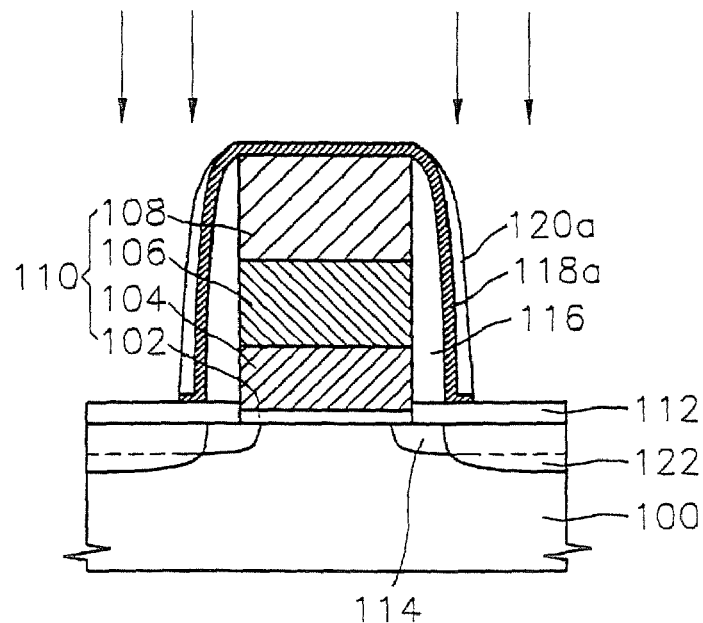

Referring now to FIG. 7, a barrier layer spacer 118a is formed by, for example, etching the barrier layer 118 on the insulating layer 112 so as to be aligned with the gate sacrificial spacer 120a. A high-concentration impurity region is formed in the integrated circuit substrate 100 by, for example, ion-implanting impurities so as to be aligned with the gate sacrificial spacer 120a and the barrier layer spacer 118a. The high-concentration impurity region is a portion of the source/drain region, which may be an n$^+$ impurity region in an NMOS transistor and p$^+$ impurity region in a PMOS transistor. As used herein, "p+" or "n+" refer to regions that are defined by higher carrier concentrations than are present in adjacent or other regions of the same or another layer or substrate. As a result, the source/drain region includes a lightly doped drain (LDD) structure, which consists of a low-concentration impurity region 114 (lightly doped portion) and a high-concentration impurity region 122 (highly doped portion). In certain embodiments the source/drain region forms an LDD structure, but embodiments of the present invention should not be limited to this configuration. It is possible to form a transistor without forming the low-concentration impurity region 114.

Figure 8:
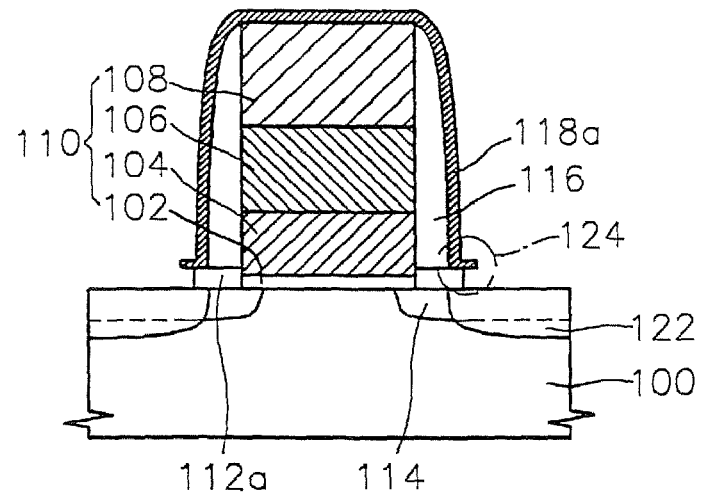

Referring now to FIG. 8, the gate sacrificial spacer 120a is removed. It may be removed by, for example, performing a wet etch or by carrying out a cleaning process for forming a silicon epitaxial layer. While the gate sacrificial spacer 120a is removed, the insulating layer 112 formed on the integrated circuit substrate 100 in the lower part of the gate sacrificial spacer 120a is etched. The insulating layer 112 is etched to form an insulating layer pattern 112a (silicide barrier layer) that exposes a lower surface of the barrier layer spacer 118a. The insulating layer pattern 112a may be, for example, an oxide layer pattern. The etch of the insulating layer 112 may further expose the surface of the high-concentration impurity region 122.

Accordingly, as illustrated in FIG. 8, the lower portion of the barrier layer spacer 118a protrudes from the side of the gate spacers 116 on the insulating layer pattern 112a, which is under the gate spacers 116. Furthermore, the lower surface of the barrier layer spacer 118a is exposed, thus forming offsets 124. In other words, the barrier layer spacer 118a is formed on the gate stack pattern 110 and the gate spacers 116 and has offsets 124 protruding from the lower part of the gate spacers 116 in the planar direction of the integrated circuit substrate 100. The offsets 124 of the barrier layer spacer 118a are a cantilevered portion of the barrier layer spacer 118a. The presence of the offsets 124 or cantilevered portion may reduce the likelihood that the silicide layer will be formed too close to the edge of the high-concentration impurity region 122 under the gate spacers 116 and/or too deep into the substrate 100 and may increase the likelihood of providing a uniform junction in a subsequent process.

Figure 9:
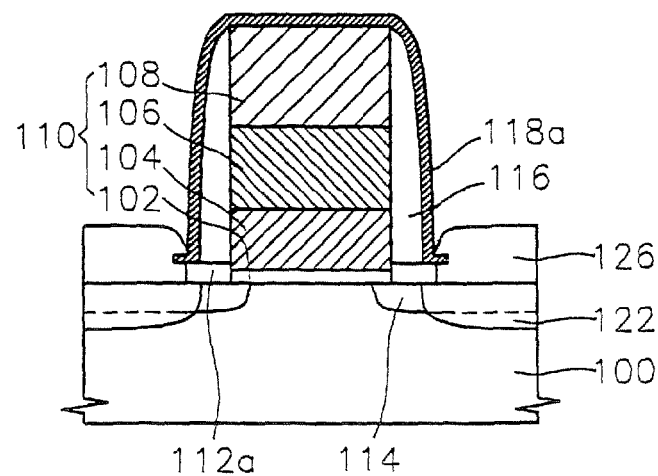

Referring now to FIG. 9, a silicon epitaxial layer 126 is formed on the exposed high-concentration impurity region 122 using, for example, a selective epitaxial growth (SEG) method. The silicon epitaxial layer 126 may be formed to be sufficiently thick to substantially cover the offsets 124. As illustrated, the silicon epitaxial layer 126 forms a facet towards the edge of the gate spacers 116.

Figure 10:
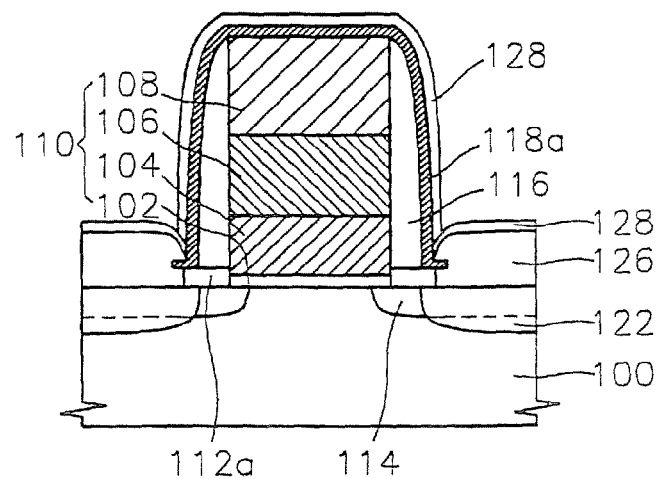

Referring now to FIG. 10, a metal layer 128 is formed on the surface of the integrated circuit substrate 100 having the barrier layer spacer 118a. The metal layer 128 is formed on the barrier layer spacer 118a and the silicon epitaxial layer 126. The metal layer 128 may be Co, Ni, Ti or the like.

Figure 11:
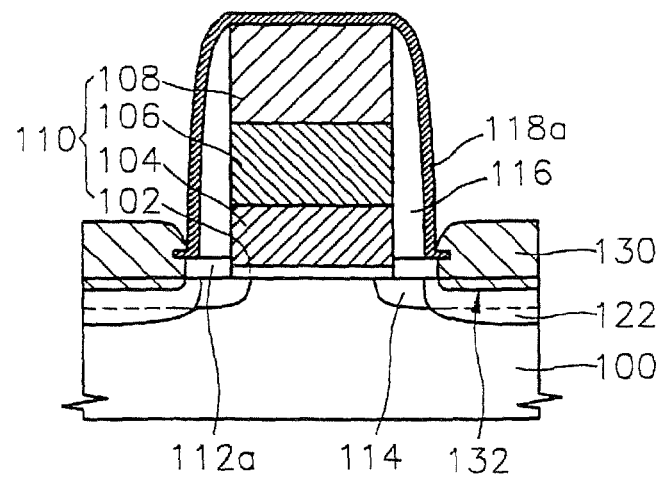

Referring now to FIG. 11, a silicidation process is performed by, for example, thermally treating the metal layer 128. The silicon epitaxial layer 126 formed on the high-concentration impurity region 122 becomes a silicide layer 130. During the silicidation process, the offsets 124 may reduce the likelihood that the silicide layer 130 will be formed too close the edge of the high-concentration impurity region 122 under the gate spacers 116 and/or too deep in the integrated circuit substrate 100, which can provide a uniform silicide junction 132. In some embodiments the metal layer 128 is thin, in these embodiments only part of the silicon epitaxial layer 126 may form the silicide layer 130 in the silicidation process. The metal layer 128 formed on the barrier layer spacer 118a may not become a silicide layer, and it may be removed by performing a wet etch in a subsequent process.

As illustrated in FIG. 11, a boundary between the low concentration impurity region 114 and the high concentration impurity region 122 may be between an outer surface of the spacers 116 and an inner surface of the spacers 116 that contacts the gate sidewalls. As further illustrated in FIG. 11, an end of the insulating layer pattern 112a (silicide barrier layer) extends away from the gate 110 beyond the boundary between the low concentration impurity region 114 and the high concentration impurity region 122 of the source and/or drain regions. A cantilevered portion of the barrier layer spacer 118a is disposed on the insulating layer pattern 112a such that a lower surface of the cantilevered portion of the barrier layer spacer 118a is exposed facing the substrate 100.

A silicide layer 130 is formed on the high concentration impurity region 122 extending into the high concentration impurity region 122. The presence of the insulating layer pattern 112a and the barrier layer spacer 118a may provide a silicide layer 130 that does not extend towards the gate 110 beyond the boundary between the low concentration impurity region 114 and the high concentration impurity region 122 as illustrated in FIG. 11. Furthermore, the silicide layer 130 also does not extend into the substrate deeper than the low concentration impurity region 114. Accordingly, a silicide layer 130 may be formed according to embodiments of the present invention that does not extend to close to the boundary of the low concentration impurity region 114 and the high concentration impurity region 122 or extend too deep into the substrate 100. Furthermore, a silicide layer 130 having a uniform junction with the source and drain regions may be provided.

Figure 12:
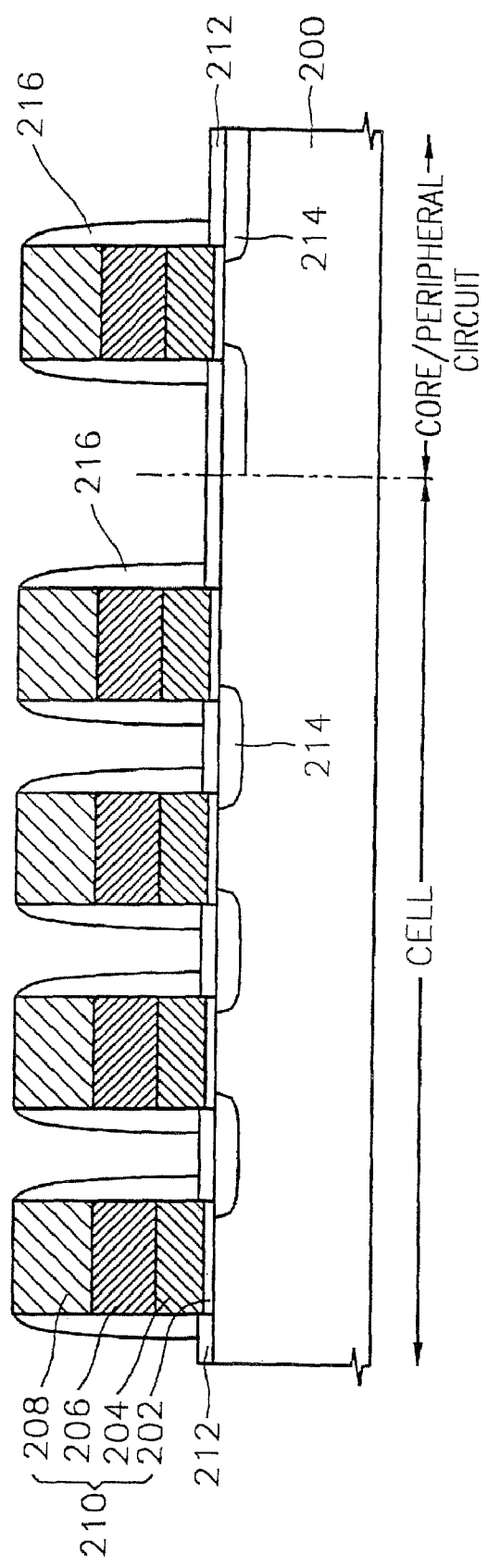
FIGS. 12 through 20 are cross sectional views illustrating processing steps in the fabrication of integrated circuit devices according to further embodiments of the present invention.

Further embodiments of the present invention will be discussed with respect to FIGS. 12 through 20. FIGS. 12 through 20 are cross sectional views of integrated circuit devices according to further embodiments of the present invention during intermediate fabrication steps according to further embodiments of the present invention. Referring now to FIG. 12, an integrated circuit substrate 200 is divided into a first region and a second region. The first region may be a cell region where memory cells are formed for, for example, a dynamic random access memory (DRAM) device. The second region is a core/peripheral circuit region. The cell region may be an NMOS transistor and the core/peripheral circuit region may be an NMOS transistor and/or a PMOS transistor. In other words, either an NMOS transistor or a PMOS transistor or both may be formed in the core/peripheral circuit region.

As further illustrated in FIG. 12, gate stack patterns 210 are formed on the integrated circuit substrate 200, which is separated into the cell region and the core/peripheral circuit region. The gate stack patterns 210 are composed of a gate insulating layer 202, gate electrodes 204 and 206, and a capping layer 208. The gate insulating layer 202 may include, for example, oxide, and the gate electrodes 204 and 206 may include, for example, polysilicon 204 and tungsten silicide 206, respectively. The capping layer 208 may include, for example, nitride. Although embodiments of the present invention are described herein with respect to gates having a gate stack pattern, embodiments of the present invention are not limited to this configuration. Other conventional gates may be used without departing from the teachings of the present invention.

An insulating layer 212 may be formed on the surface of the integrated circuit substrate 100. The insulating layer 212 may be, for example, an oxide layer. In these embodiments, the oxide layer is formed by oxidizing the integrated circuit substrate 200 having the gate stack patterns 210. The insulating layer 212 may reduce the damage caused by etching. During the oxidation of the integrated circuit substrate 200, a thin oxide layer (not shown) may also be formed on both sidewalls of the gate electrodes 204 and 206, but this is not illustrated in the drawings for the sake of convenience.

Low concentration impurity regions 214 are formed on the integrated circuit substrate 200 having the cell region and the core/peripheral circuit region so as to be aligned with the gate stack patterns 210. The low-concentration impurity regions 214 may be a source/drain region. The low-concentration impurity regions 214 are formed to be an n-type impurity region in the cell region. In the core/peripheral circuit region, in the case of an NMOS transistor, the low-concentration impurity regions 214 are formed to be an n-type impurity region, and in case of a PMOS transistor, a p-type impurity region.

Gate spacers 216 are formed on both sidewalls of the gate stack patterns 210 in the cell region and the core/peripheral circuit region. The gate spacers 216 are formed by, for example, performing an anisotropic etch after a nitride layer is formed on the surface of the integrated circuit substrate 200 having the gate stack patterns 210. It will be understood that other conventional gate spacers may be formed without departing from the teachings of the present invention.

Figure 13:
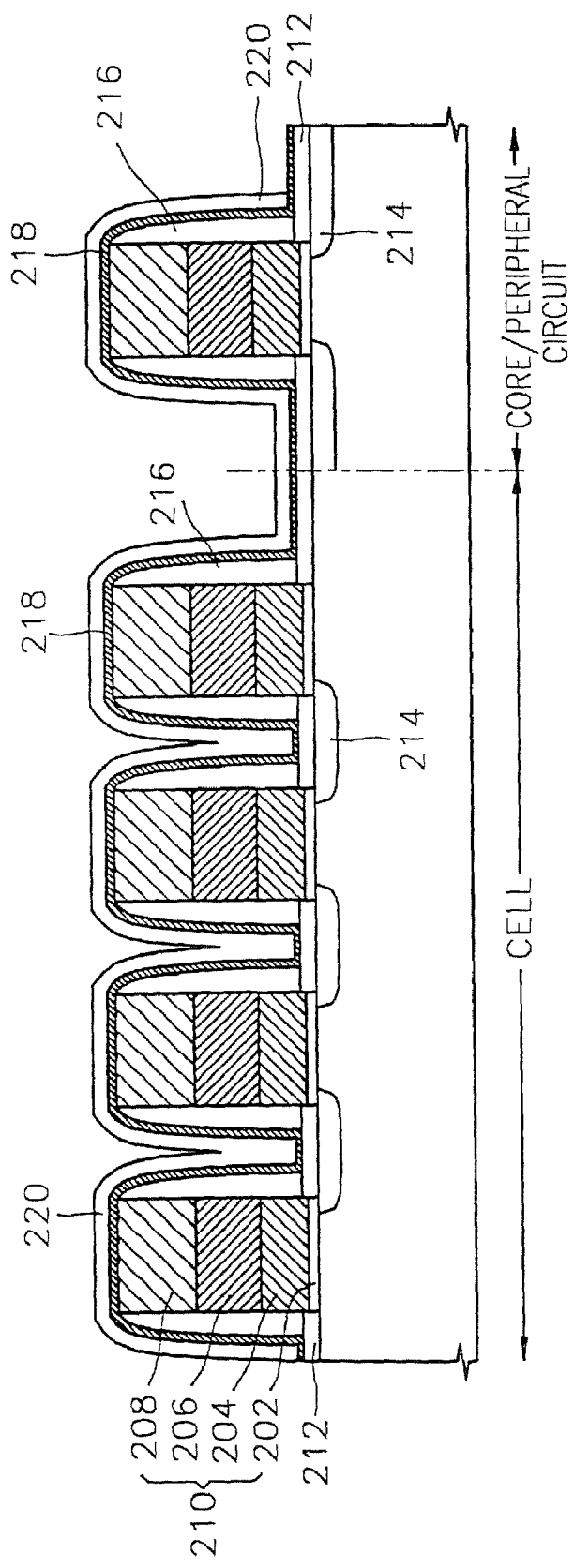

Referring now to FIG. 13, a barrier layer 218 and a sacrificial layer 220 are formed on the surface of the integrated circuit substrate 200 having the gate stack patterns 210 and the gate spacers 216. In other words, the barrier layer 218 and the sacrificial layer 220 are formed on the surface of the integrated circuit substrate 200 having the cell region and the core/peripheral circuit region. The barrier layer 218 may be, for example, a nitride layer and the sacrificial layer 220 may be, for example, an oxide layer. The barrier layer 218 formed in the cell region may act as an etch stop layer in a subsequent self-aligning contact process, and the thickness of the sacrificial layer 220 formed in the core/peripheral circuit region may contribute to determining the size of the high-concentration impurity region in a subsequent ion-implant process.

Figure 14:
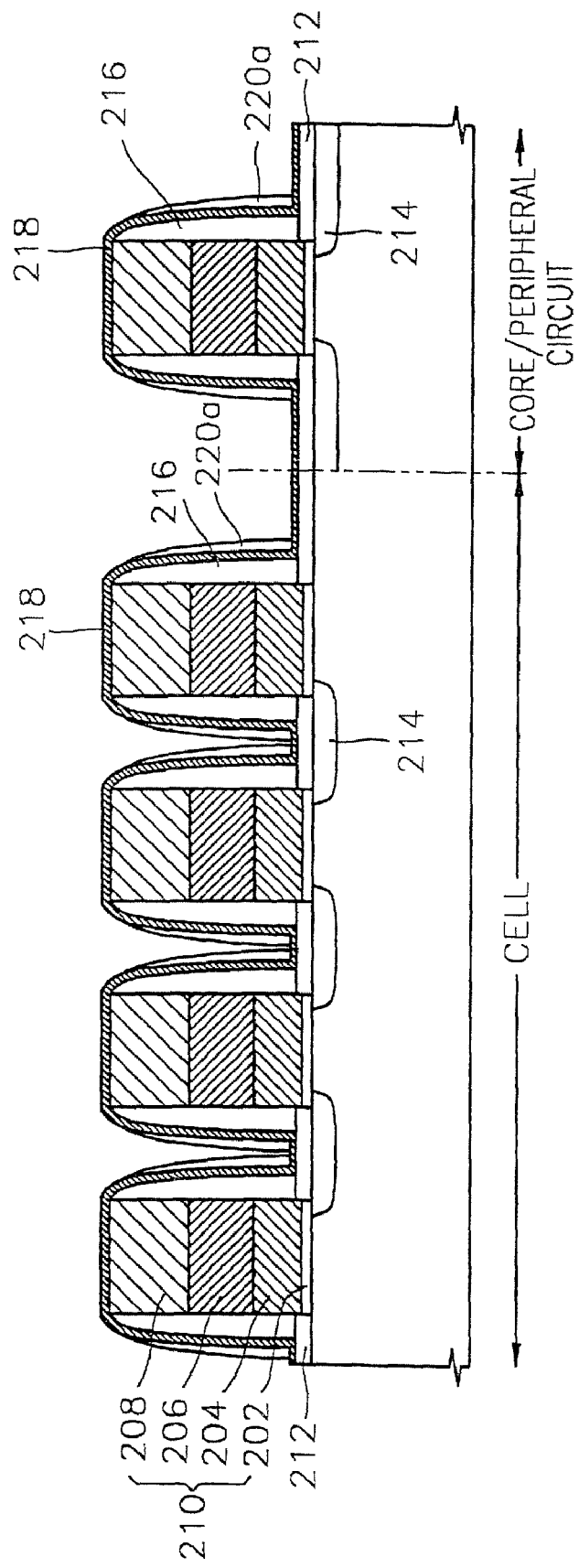

Referring now to FIG. 14, gate sacrificial spacers 220a are formed on the barrier layer 218 on the upper part of the gate spacers 216 by, for example, etching the sacrificial layer 220 anisotropically. Accordingly, the gate spacers 216, barrier layer 218, and gate sacrificial spacers 220a are formed sequentially on the sidewalls of the gate stack patterns 210 in the cell and core/peripheral circuit regions.

Figure 15:
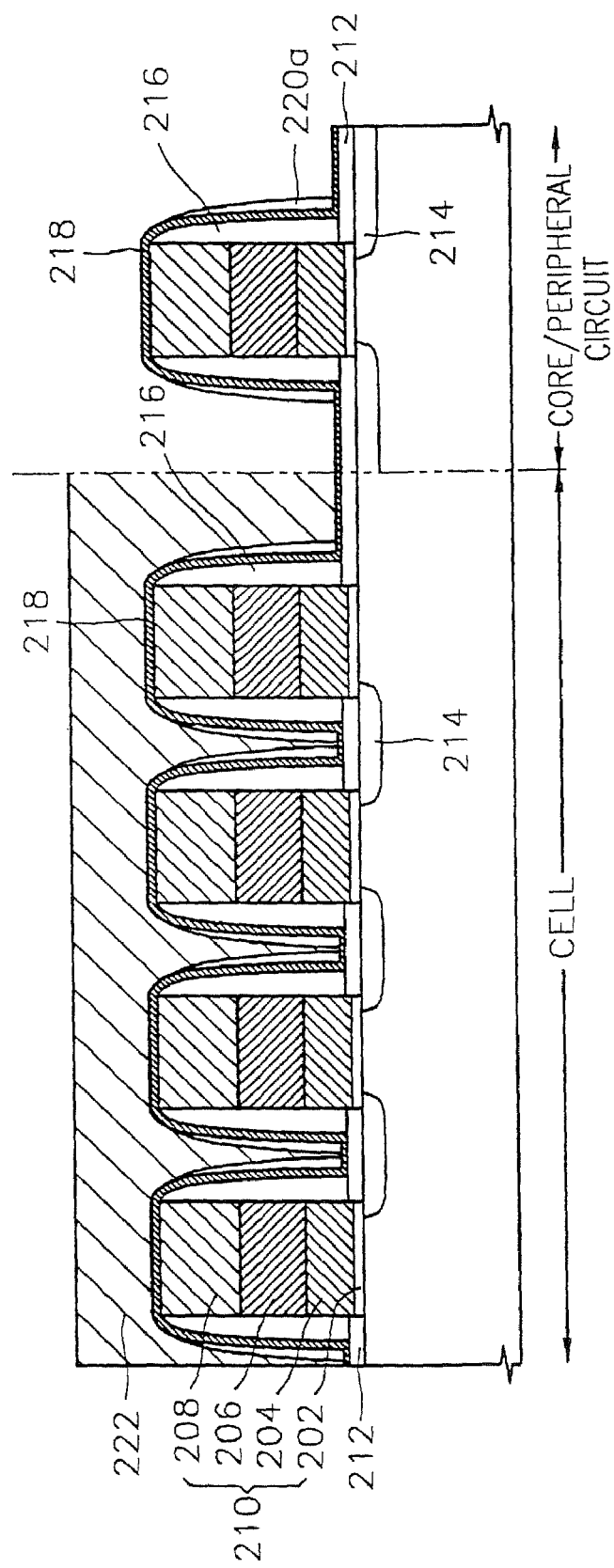

Referring now to FIG. 15, a photoresist pattern 222 is formed to cover the cell region and to form a high-concentration impurity region in the core/peripheral circuit region in the subsequent process. The photoresist pattern 222 is formed, for example, using a conventional photolithography process.

Figure 16:
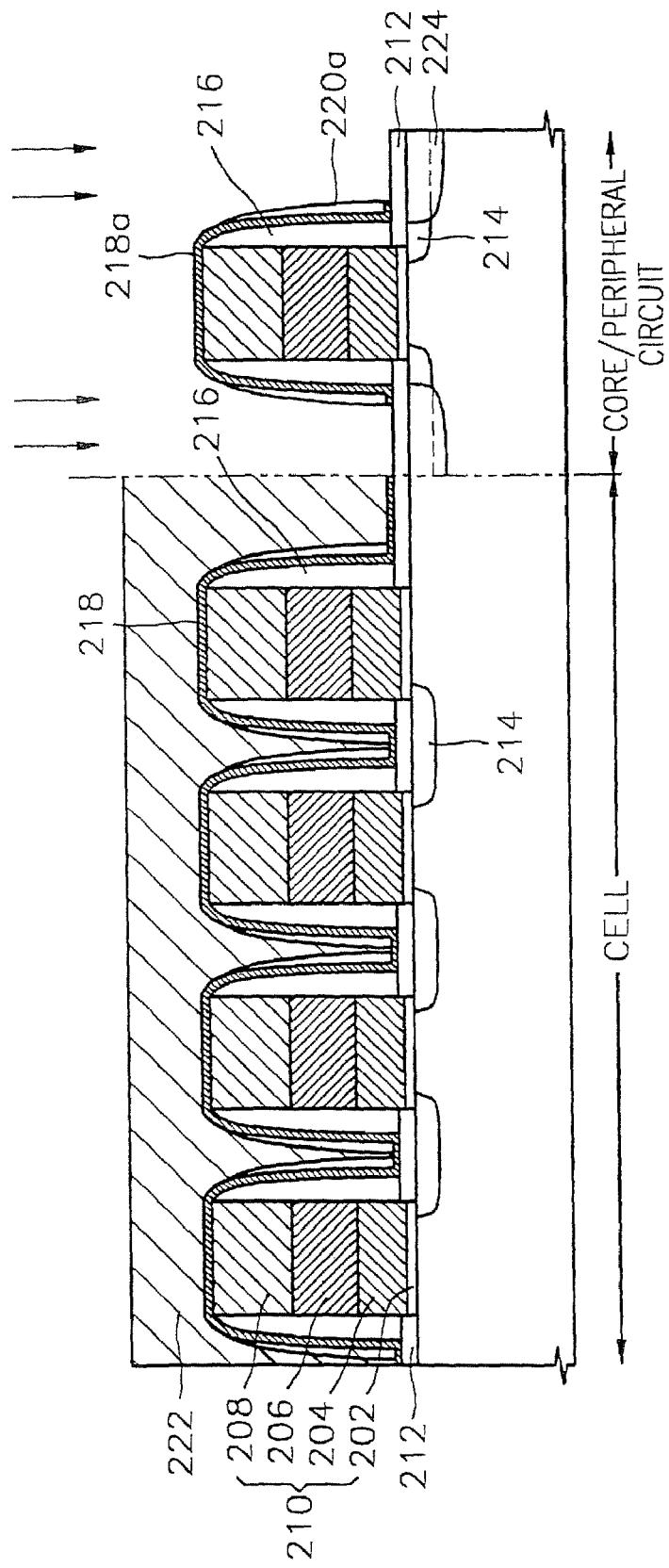

Referring now to FIG. 16, barrier layer spacers 218a are formed by, for example, anisotropically etching the barrier layer 218 formed on the insulating layer 212 of the core/peripheral circuit region to be aligned with the gate sacrificial spacers 220a. The insulating layer 212 remains on the integrated circuit substrate 200 on both sides of the gate sacrificial spacers 216 in the core/peripheral circuit region.

A high-concentration impurity region 224 is formed by, for example, implanting impurities so as to be aligned with the barrier layer spacer 218a and the gate sacrificial spacers 220a in the core/peripheral circuit region, using the photoresist pattern 222 of the cell region as an ion implant mask. As described previously, the high-concentration impurity region 224 is formed to be an $n^+$ impurity region or a $p^+$ impurity region. As a result, a source/drain region of an LDD structure is formed consisting of the low-concentration impurity region 214 (lightly doped portion) and the high-concentration impurity region 224 (highly doped portion) in the core/peripheral circuit region. It will be understood that although the source/drain region of an LDD structure is formed in the core/peripheral circuit region in the illustrated embodiment, the transistor may be formed without forming the low-concentrated impurity region 214.

Figure 17:
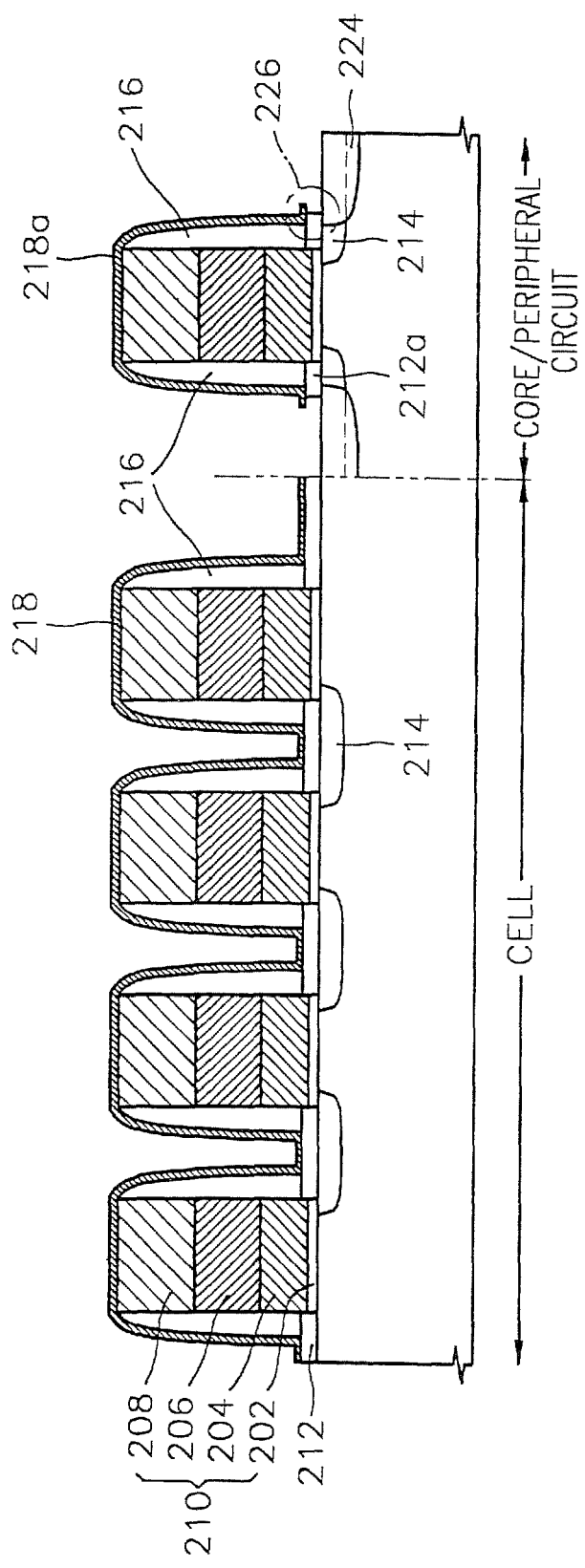

Referring now to FIG. 17, the gate sacrificial spacer 220a in the core/peripheral circuit region is removed. It is removed by, for example, performing a wet etch or by using a subsequent cleaning process for forming a silicon epitaxial layer. When the gate sacrificial spacers 220a in the core/peripheral circuit region are removed, the insulating layer 212 formed on the integrated circuit substrate 200 is etched, thus forming an insulating layer pattern 212a (silicide barrier layer) that exposes the lower surface of the barrier layer spacer 218a. The surface of the high-concentration impurity region 224 is exposed in the core/peripheral circuit region.

Accordingly, the lower part of the barrier layer spacer 218a protrudes from the side surface of the gate spacers 216 on the insulating layer pattern 212a which is under the both gate spacers 216, and forms offsets 226 that expose the lower surface of the barrier layer spacer 218a. In other words, the barrier layer spacer 218a is formed on the gate stack pattern 210 and the gate spacers 216, and it has offsets 226 that protrude in the planar direction of the integrated circuit substrate 200 and from under the gate spacers 216. The offsets 226 of the barrier layer spacer 218a are a cantilevered portion of the barrier layer spacer 218a. The presence of the offsets 226 may reduce the likelihood that a silicide layer may be formed too close to the edge of the high-concentration impurity region, under the gate spacers 216, and/or too deep into the substrate and may possibly increase the likelihood that the silicide junction will be uniform.

The photoresist pattern 222, which is used as an ion implant mask is removed, and the gate sacrificial spacers 220a in the cell region are removed by carrying out a wet etch. In the cell area, the whole surface of the integrated circuit substrate 200 becomes covered with the barrier layer 218. With the barrier layers 218 formed between the gate stack patterns 210, the integrated circuit device may have excellent peeling characteristics in a subsequent process for forming an interlayer insulating layer. In the core/peripheral circuit region, the barrier layer spacers 218a with offsets 226 are formed on the gate spacers, and the high-concentration impurity region 224 is exposed.

Figure 18:
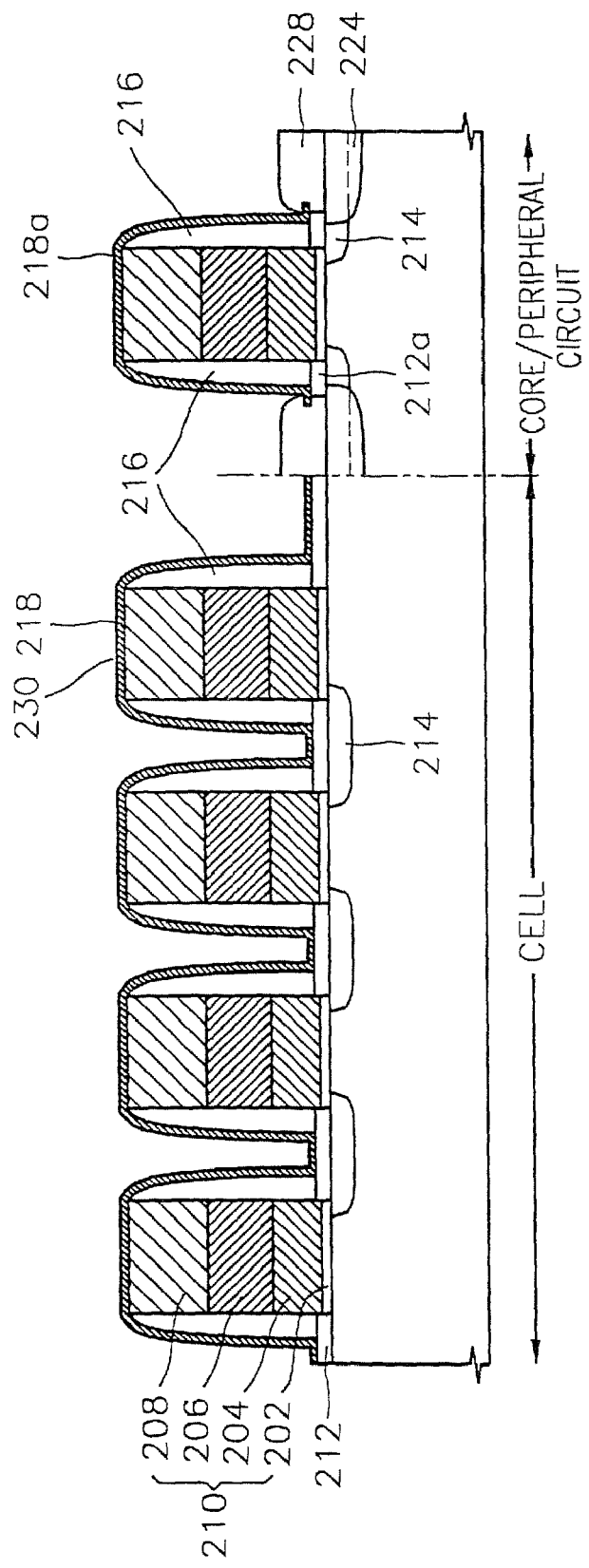

Referring now to FIG. 18, a silicon epitaxial layer 228 is selectively formed on the high-concentration impurity region 224 exposed in the core/peripheral circuit region, by using the SEG method. The silicon epitaxial layer 228 is formed sufficiently thick to cover the offsets 226. The silicon epitaxial layer 228 is formed in the core/peripheral circuit region but not in the cell region because the cell region is covered with the barrier layer 218. The silicon epitaxial layer 228 forms a facet towards the edge of the gate spacers 216.

Figure 19:
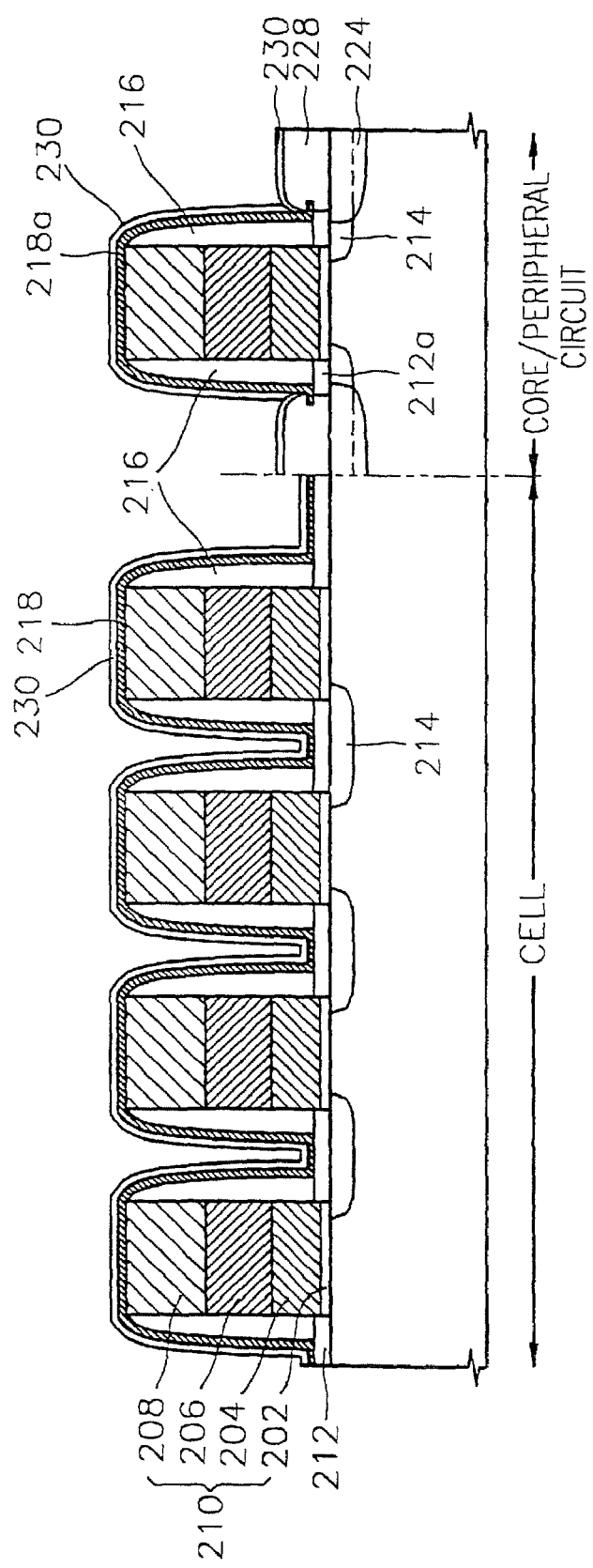

Referring now to FIG. 19, a metal layer 230 is formed on the surface of the cell and the core/peripheral circuit regions. The metal layer 230 is formed on the barrier layer 218 in the cell region and on the barrier layer spacer 218a and the silicon epitaxial region 228 in the core/peripheral circuit region. The metal layer 230 may be formed of, for example, Co, Ni, Ti, or the like.

Figure 20:
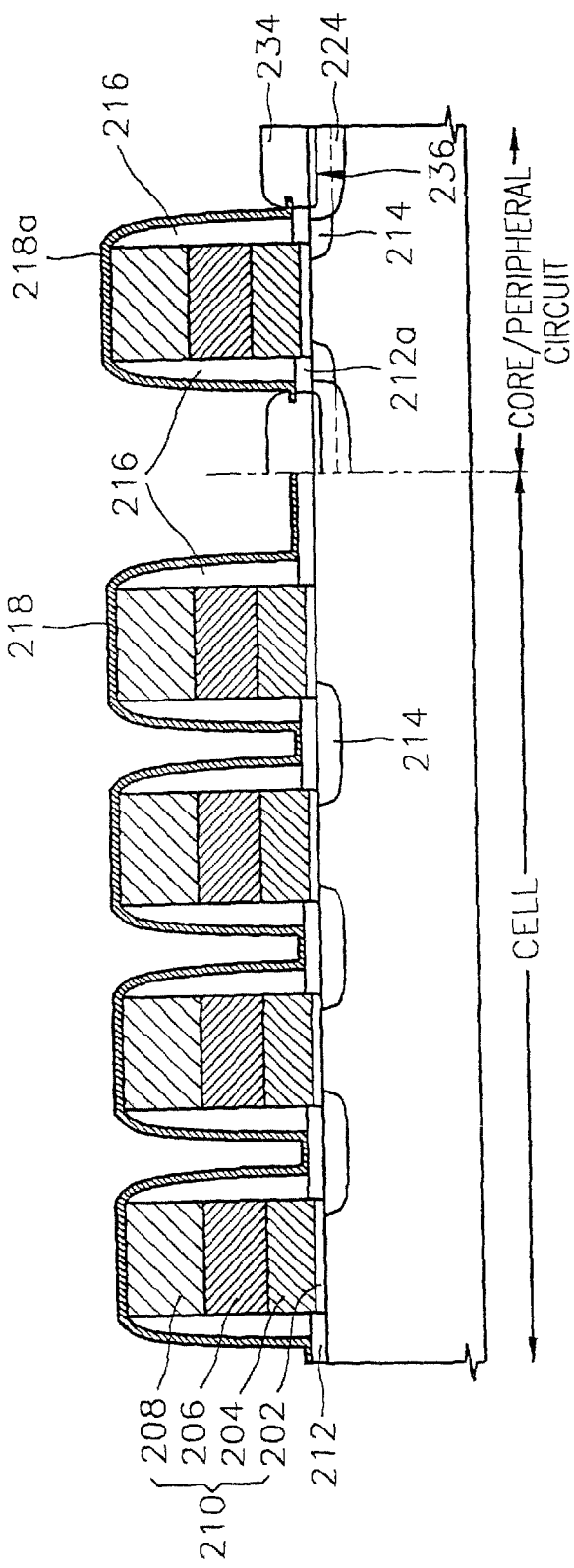

Referring now to FIG. 20, a silicidation process is performed by, for example, thermally treating the metal layer 230 formed in the cell and core/peripheral circuit regions. The silicon epitaxial region 228 formed on the high-concentration impurity region 224 of the core/peripheral circuit region becomes a silicide layer 234. During silicidation, the presence of the offsets 226 may reduce the likelihood that the silicide layer 232 is formed too close to the edge of the high-concentration impurity region, under the gate spacers 216 and/or too deep into the substrate, and thus the silicide junction may be uniform. In some embodiments of the present invention, if the metal layer 230 is thin, only part of the silicon epitaxial layer 228 may become a silicide layer in the silicidation process.

The metal layer 230, which is formed on the barrier layer 218 and the barrier layer spacer 218a in the cell and core/peripheral circuit region, may not become a silicide layer. The metal layer 230 that does not form a silicide layer may be removed by performing wet etch in a subsequent process. As shown above, embodiments of the present invention may selectively form the silicon epitaxial layer 228 and a silicide layer 234 in the core/peripheral circuit region, but not in the cell region, without increasing the number of photomasks needed.

As described above with respect to FIGS. 4 through 20, embodiments of the present invention can provide integrated circuit devices having a barrier layer spacer that extends beyond an end of the oxide layer and exposes a portion of the source and drain regions (offsets). The formation of these offsets may inhibit the formation of a silicide near the edge of the source/drain region as discussed herein. Accordingly, integrated circuits according to embodiments of the present invention may provide integrated circuit devices having improved junction leakage current characteristics.

Further, when applied to a DRAM device, according to embodiments of the present invention, a silicon epitaxial layer and a silicide layer may be selectively formed in the core/peripheral circuit region, but not in the cell region, without increasing the number of photomasks used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
an integrated circuit substrate;
a gate insulating layer on the integrated circuit substrate;
a gate electrode on the gate insulating layer;
an insulating capping layer on the gate electrode;
an insulating layer formed on the integrated circuit substrate and a sidewall of the gate insulating layer;
a barrier layer spacer on a sidewall of the gate electrode and the insulating capping layer, the barrier layer spacer having a cantilevered portion that extends away from the sidewall of the gate electrode and formed on the insulating layer, wherein a thickness of the insulating layer is thicker than that of the gate insulating layer.

2. The integrated circuit device according to claim 1, further comprising a gate spacer between the sidewall of the the insulating capping layer and the barrier layer spacer.

3. The integrated circuit device according to claim 2, wherein the gate spacer covers a portion of the sidewall of the gate electrode.

4. The integrated circuit device according to claim 1, wherein the cantilevered portion is formed on a lower portion of the barrier layer spacer.

5. The integrated circuit device according to claim 4, further comprising a silicon epitaxial layer contacting an upper surface of the cantilevered portion of the barrier layer spacer.

6. The integrated circuit device according to claim 5, further comprising a source and drain region in the integrated circuit substrate on both sides on the gate electrode, the silicon epitaxial layer being formed on the source and drain region.

7. The integrated circuit device according to claim 6, wherein the insulating layer is formed on the source and drain region of the integrated circuit substrate, the insulating layer exposing a portion of the source and drain region.

8. The integrated circuit device according to claim 7, further comprising a silicide layer on the silicon epitaxial layer.

9. The integrated circuit device according to claim 1, wherein the insulating capping layer comprises a nitride layer.

10. The integrated circuit device according to claim 1, wherein the insulating layer comprises an oxide layer.

11. The integrated circuit device according to claim 1, wherein the gate electrode comprises polysilicon and tungsten silicide.

12. The integrated circuit device according to claim 1, wherein the barrier layer spacer comprises a nitride layer.

13. An integrated circuit device, comprising:
an integrated circuit substrate;
a gate insulating layer on the integrated circuit substrate;
a gate electrode on the gate insulating layer;
an insulating capping layer on the gate electrode;
an insulating layer formed on the integrated circuit substrate and a sidewall of the gate insulating layer, a thickness of the insulating layer being thicker than that of the gate insulating layer;
a barrier layer spacer on a sidewall of the gate electrode and the insulating capping layer, the barrier layer spacer having a cantilevered portion that extends away from the sidewall of the gate electrode and formed on the insulating layer; and
a gate spacer formed between a portion of the sidewall of the gate electrode and the insulating capping layer and the barrier layer spacer.

14. The integrated circuit device according to claim 13, wherein the gate spacer covers a portion of the sidewall of the gate electrode.

15. The integrated circuit device according to claim 13, wherein the cantilevered portion is formed on a lower portion of the barrier layer spacer.

16. The integrated circuit device according to claim 15, further comprising a silicon epitaxial layer contacting an upper surface of the cantilevered portion of the barrier layer spacer.

17. The integrated circuit device according to claim 16, further comprising a source and drain region in the integrated circuit substrate on both sides on the gate electrode, the silicon epitaxial layer being formed on the source and drain region.

18. The integrated circuit device according to claim 17, wherein the insulating layer is formed on the source and drain region of the integrated circuit substrate, the insulating layer exposing a portion of the source and drain region.

19. The integrated circuit device according to claim 18, further comprising a silicide layer on the silicon epitaxial layer.

20. The integrated circuit device according to claim 13, wherein the insulating capping layer comprises a nitride layer.

21. The integrated circuit device according to claim 13, wherein the insulating layer comprises an oxide layer.

22. The integrated circuit device according to claim 13, wherein the gate electrode comprises polysilicon and tungsten silicide.

23. The integrated circuit device according to claim 13, wherein the barrier layer spacer comprises a nitride layer.

24. The integrated circuit device according to claim 13, further comprising another barrier layer spacer formed on an opposite side of the sidewall of the gate electrode and the insulating capping layer.

25. An integrated circuit device, comprising:
an integrated circuit substrate;
a gate insulating layer on the integrated circuit substrate;
a gate electrode on the gate insulating layer;
an insulating capping layer on the gate electrode;
an insulating layer formed on the integrated circuit substrate and a sidewall of the gate insulating layer;
a barrier layer spacer on a sidewall of the gate electrode and the insulating capping layer, the barrier layer spacer having a cantilevered portion that extends away from the sidewall of the gate electrode and formed on the insulating layer;
a gate spacer formed between a portion of the sidewall of the gate electrode and the insulating capping layer and the barrier layer spacer; and
a silicon epitaxial layer contacting an upper surface of the cantilevered portion of the barrier layer spacer.

26. The integrated circuit device according to claim 25, wherein the gate spacer covers a portion of the sidewall of the gate electrode.

27. The integrated circuit device according to claim 25, wherein the cantilevered portion is formed on a lower portion of the barrier layer spacer.

28. The integrated circuit device according to claim 25, further comprising a source and drain region in the integrated circuit substrate on both sides on the gate electrode, the silicon epitaxial layer being formed on the source and drain region.

29. The integrated circuit device according to claim 25, wherein the insulating layer is formed on the source and drain region of the integrated circuit substrate, the insulating layer exposing a portion of the source and drain region.

30. The integrated circuit device according to claim 25, further comprising a silicide layer on the silicon epitaxial layer.

31. The integrated circuit device according to claim 25, further comprising another barrier layer spacer formed on an opposite side of the sidewall of the gate electrode and the insulating capping layer.

32. An integrated circuit device, comprising:
an integrated circuit substrate having a cell region and a peripheral region;
a gate insulating layer in the peripheral region of the integrated circuit substrate;
a gate electrode on the gate insulating layer;
an insulating capping layer on the gate electrode;
a source and a drain region in the integrated circuit substrate on both sides of the gate electrode;
an insulating layer formed on the integrated circuit substrate and a sidewall of the gate insulating layer;
a barrier layer spacer on a sidewall of the gate electrode and the insulating capping layer, the barrier layer spacer having a cantilevered portion that extends away from the sidewall of the gate electrode and formed on the insulating layer; and
a gate spacer formed between a portion of the sidewall of the gate electrode and the insulating capping layer and the barrier layer spacer.

33. The integrated circuit device according to claim 32, further comprising a silicon epitaxial layer contacting an upper surface of the cantilevered portion of the barrier layer spacer, the silicon epitaxial layer being formed on the source and drain region.

34. The integrated circuit device according to claim 33, further comprising a silicide layer formed on the silicon epitaxial layer.

35. The integrated circuit device according to claim 32, wherein the gate spacer covers a portion of the sidewall of the gate electrode.

36. The integrated circuit device according to claim 32, wherein the cantilevered portion is formed on a lower portion of the barrier layer spacer.

37. The integrated circuit device according to claim 32, wherein the insulating layer is formed on the source and drain region of the integrated circuit substrate, the insulating layer exposing a portion of the source and drain region.

38. The integrated circuit device according to claim 32, further comprising another barrier layer spacer formed on an opposite side of the sidewall of the gate electrode and the insulating capping layer.

* * * * *